United States Patent [19]

Ma et al.

[11] Patent Number: 5,393,580
[45] Date of Patent: Feb. 28, 1995

[54] ELEMENT CONTAINING LATENT IMAGE SUITED FOR AQUEOUS WASH-OUT DEVELOPMENT

[75] Inventors: Sheau-Hwa Ma, Chadds Ford, Pa.; Andrew E. Matthews, Leeds, England

[73] Assignee: E. I. Du Pont de Nemours and Company, Wilmington, Del.

[21] Appl. No.: 170,132

[22] Filed: Dec. 20, 1993

Related U.S. Application Data

[62] Division of Ser. No. 994,821, Dec. 22, 1992, Pat. No. 5,292,556.

[51] Int. Cl.⁶ .............................................. B05D 3/10
[52] U.S. Cl. ..................................... 428/29; 427/264; 427/273
[58] Field of Search .................... 427/264, 273; 428/29

[56] References Cited

U.S. PATENT DOCUMENTS

| | | | |
|---|---|---|---|
| 5,032,216 | 7/1991 | Felten | 156/628 |
| 5,200,307 | 4/1993 | Takahashi | 430/507 |
| 5,270,078 | 12/1993 | Walker et al. | 428/29 X |
| 5,292,556 | 3/1994 | Ma et al. | 428/29 X |

FOREIGN PATENT DOCUMENTS

| | | | |
|---|---|---|---|
| 55-49288 | 4/1980 | Japan | 427/273 |
| 1431462 | 4/1976 | United Kingdom | 428/195 |

*Primary Examiner*—Henry F. Epstein

[57] ABSTRACT

A method for preparing high resolution negative-working wash-off relief images comprising the sequential steps of: (a) providing a non-photosensitive, aqueous processable layer, preferably on a substrate, said layer comprising a dispersion of solvent-coalesceable particles in a polymer matrix; (b) imagewise applying an ink to the non-photosensitive layer to coalesce the particles and form a water-insoluble polymer blend between the particles and the polymer matrix in the ink applied areas; and (c) washing the layer with an aqueous developer solution to remove the non-ink applied areas of the layer.

9 Claims, No Drawings

ELEMENT CONTAINING LATENT IMAGE SUITED FOR AQUEOUS WASH-OUT DEVELOPMENT

This is a division of application Ser. No. 07/994,821, filed Dec. 22, 1992, now U.S. Pat. No. 5,292,556.

FIELD OF INVENTION

This invention relates to a method for preparing high resolution negative-working wash-off relief images from non-photosensitive elements and to elements for use therein.

BACKGROUND OF THE INVENTION

It has long been known in the art that images may be prepared using what is known as a "wash-off" development step in which a latent image is developed by washing with water or other aqueous or non-aqueous developing solution. Such techniques have been widely used in the preparation of flexographic plates, printed circuits, etc. from photosensitive compositions.

It is also known in the art that relief images may be prepared from photosensitive or non-photosensitive elements using wash-off development techniques in which the image layer is applied with an ink jet printer. British Patent 1,431,462 teaches such a method. More specifically, this patent teaches both positive and negative-working systems for forming a relief image using primarily natural proteinaceous materials. In the negative-working system, a polymer coating (e.g. gelatin) is crosslinked, polymerized, or otherwise imagewise hardened by applying a suitable agent (e.g. formaldehyde) using ink jet printing and then dissolving the unhardened areas with a developing solution. In the positive-working system, ink jet printing is used to apply an agent (e.g. enzyme) which will degrade an otherwise insoluble polymer coating, thus rendering it soluble in the developing solution.

Although desirable in principle, the methods disclosed in the aforementioned British Patent are disadvantageous in practice. First, the natural proteinaceous polymers disclosed in this patent lack many physical characteristics necessary from most relief applications, thus rendering such reliefs of limited practical or commercial utility. Second, crosslinking and degradation reactions are relatively slow, particularly at room temperature, thus decreasing the efficiency of the process. The patent teaches that heat could be applied to facilitate the reaction, but this requires an additional step and presents other complications. Third, many of the crosslinking agents, such as aldehydes, are environmentally disadvantageous. Fourth, the use of photopolymerizable compositions requires an additional exposure step, which increases costs and lowers efficiency. Fifth, many of the developing solutions are organic solvent-based, are highly alkaline, or are maintained at elevated temperatures and thus present additional environmental and safety hazards. Sixth, the latent images generated by such methods are not stable, reducing the utility of the process. Finally, the resolution obtainable from these methods was only marginal and often insufficient for demanding commercial application.

The present invention overcomes many of these disadvantages and provides a process which poses minimal environmental risks, is easy to use and has the capability of producing images of high resolution in a very short period of time.

SUMMARY OF THE INVENTION

The invention is directed to a method for preparing high resolution negative-working wash-off relief images comprising the sequential steps of:
  (a) providing a non-photosensitive, aqueous processable layer, preferably on a substrate, said layer comprising a dispersion of solvent-coalesceable particles in a polymer matrix;
  (b) imagewise applying an ink to the non-photosensitive layer to coalesce the particles and form a water-insoluble polymer blend of the coalesced particles with the polymer matrix in the ink applied areas; and
  (c) washing the non-photosensitive layer with an aqueous developer solution to remove the non-ink applied areas of the layer.

In another aspect, the present invention comprises an image formed according to the above process.

In still another aspect, the present invention comprises an aqueous solution developable element containing a latent image, said element comprising a non-photosensitive layer, preferably on a substrate, said non-photosensitive layer comprising:
  (a) non-imaged areas comprising a dispersion of solvent-coalesceable particles in a polymer matrix, said polymer matrix being capable of being removed with an aqueous developer; and
  (b) imaged areas comprising a latent image in the form of a stable, water-insoluble polymer blend of the particles and the polymer matrix.

In the preferred embodiments, the step of applying the aqueous ink is accomplished by use of an ink jet printer.

DETAILED DESCRIPTION OF THE INVENTION

The present invention offers several advantages over the prior art described above. For example, the present invention is more environmentally sound than the prior art because it utilizes aqueous solutions for development. In addition, the present process does not use potentially toxic monomers, and requires no additional heating or exposure steps, whereby the process is safer and easier to use.

Images formed by the present process have surprisingly good resolution and sharp edges. The element can be washed to develop the image immediately after the image layer has been applied, which greatly simplifies the process and improves efficiency. On the other hand, the reaction between the ink and the non-photosensitive layer forms a stable, water-insoluble polymer blend, whereby, if desired, the element can be stored with the latent image intact for an indefinite period of time prior to being developed with an aqueous solution.

The preferred elements for use in the present process comprise a substrate having a non-photosensitive layer applied thereto, wherein the non-photosensitive layer comprises a dispersion of solvent-coalesceable particles in a water-soluble or water swellable polymer matrix.

Substrates

The substrate may be any suitable film of screen which has the necessary stiffness, dimensional stability, adhesion to the non-photosensitive layer and the ability to withstand the aqueous processing conditions. Examples of useful substrates include glass, cellulose triacetate, polyethylene terephthalate, etc. A removable substrate is required for the preparation of a multicolor image. Gelatin subbed and resin subbed polyethylene terephthalate films are preferred for this application. In applications such as printing plates, solder masks and printed circuits, the substrate may contain metal. Typical substrates for resist applications include combinations such as phenolic or epoxy resins on paper or a paper-glass composite, as well as polyester, epoxy, polyimide, polytetrafluoroethylene or polystyrene on glass. In most instances, these substrates are also clad with a thin layer of electroconductive metal of which copper is by far the most common. Suitable substrates for lithographic printing plates include those disclosed in U.S. Pat. Nos. 4,072,528 and 3,458,311.

Although it is preferred for a substrate to be present, it will be understood that in some circumstances, for example when the non-photosensitive layer is a self-supporting, film-forming material, no substrate need be present.

Non-Photosensitive Layer

The non-photosensitive layer comprises a dispersion of solvent-coalesceable particles in a water-soluble or water-swellable polymer matrix. If desired, colorants may also be present, as described more fully below. The non-photosensitive layer may also contain various adjuvants, such as plasticizers, adhesion promoters, coating aids and polymeric modifiers which are well known to those skilled in the art.

Solvent-Coalesceable Particles

The solvent-coalesceable particles comprise particles of a polymer which will coalesce in the presence of a non-aqueous solvent to form a continuous, water-insoluble polymer blend with the polymer matrix in the imaged areas. The particles may be comprised solely of one or more water-insoluble polymers or, more preferably, are particles having a core-shell structure. Core-shell particles contain distinct domains which are arranged so that the core is surrounded by the shell with the core and shell being linked to each other by strong physical adsorption or, preferably, chemical bonds. Both the core and shell components are preferably solid and immobile under ambient conditions.

The preferred core-shell particles comprise a water-insoluble, solvent-coalesceable core and a shell of a polymeric material that is soluble or swellable in aqueous media. The shell facilitates the dispersion of the solvent-coalesceable particles into the polymer matrix and avoids the need to use surfactants for that purpose. In the preferred core-shell particles the core is oleophilic and should have film-forming properties above the ambient temperature. The shell comprises water-soluble groups such as, for example, carboxyl, sulfonate, sulfonamide or amino, that impart solubility, or at least swellability, to the core-shell particles in an aqueous medium.

As the water-insoluble core of the core-shell particles, or as the water-insoluble particles themselves if not of a core-shell structure, polymers with a softening point in the range of 70°–200° C. can be used to particular advantage. Suitable polymers include polystyrene, polyacrylates, polyesters, polyvinylesters, polyurethanes, polyamides, polyepoxides and polyvinyl chloride.

The solvent-coalesceable particles should be smaller than 5 μm in size and preferably smaller than 1 μm.

Polymer Matrix

The polymer matrix is capable of being dissolved or removed by aqueous developers and comprises a polymer that is soluble, or at least swellable, in aqueous media. Suitable polymers include those which are themselves soluble or swellable in aqueous media and those which contain pendent groups which render the polymer soluble or swellable in such media. Examples of the former include polyvinylpyrrolidone, polyvinylalcohol and polyethyleneoxide. Examples of pendent groups which may be used to impart solublity or swellability to the polymer include carboxyl, sulfonate, sulfonamide and amino.

Carboxylated polymers, especially alkali-soluble carboxylated polymers, can be used to particular advantage in the practice of this invention. Carboxylated polymers include polymers which comprise acrylic acid, methacrylic acid, crotonic acid, itaconic acid, itaconic acid monoester, maleic acid, maleic acid monoester, etc. copolymerized with other monomers, such as, for example, methyl acrylate, methyl methacrylate, ethyl acrylate, ethyl methacrylate, butyl acrylate, butyl methacrylate, styrene, and the like.

Amine-containing polymers which are soluble in acidic solutions can also be used to particular advantage in the practice of this invention. Examples of such polymers are vinyl addition polymers, such as acrylic polymers, methacrylic polymers and styrene acrylic copolymers. The amine groups may be primary, secondary, or tertiary amine groups, or mixtures thereof. Such polymers can be conveniently prepared by polymerization techniques familiar to those skilled in the art, such as by using amine-containing monomers, which include, for example, N,N-dimethylaminoethyl acrylate, N,N-dimethylaminoethyl methacrylate, 4-aminostyrene, 2-vinyl pyridine, and the like, which may be copolymerized with other monomers, such as, for example, methyl acrylate, methyl methacrylate, ethyl acrylate, ethyl methacrylate, butyl acrylate, and butyl methacrylate, styrene, and the like.

Colorant

If a precolored element is desired for color imaging applications such as color proofing, the non-photosensitive layer may contain one or more colorants. Important criteria for the selection of the colorant are chemical stability, color, brightness of shade, and lightfastness. The colorant should not undergo chemical reaction with any of the other components of the non-photosensitive layer either before, after, or during imaging.

Useful colorants include dyes and pigments. Dyes are known to have superior color properties such as chroma and transparency, but usually are not as lightfast as pigments. Useful dyes include the Intratherm dyes, such as, for example, Intratherm Red P-1339 (Anthraquinone type, Disperse Violet 17), available from Crompton and Knowles Co., Reading, Pa. The water soluble dyes such as acid dyes, reactive dyes and basic dyes should be avoided as they will be washed off during the aqueous processing. Useful pigments include both inorganic pigments such as carbon black and graphite, and organic pigments such as Rubine F6B (Permanent Rubinc F6B; C.I. Pigment Red 184) available from Hoechst Celanese Corp., Coventry, R.I. A detailed list of commercial dyes and pigments can be found in the "Buyer's Guide For Textile Chemists And Colorists", published by American Associate of Textile Chemists And Colorists, Research Triangle Park, N.C., the disclosure of which is incorporated herein by reference.

When the selected colorant is a dye, it is particularly advantageous for the dye to be incorporated into the solvent-coalesceable particles to avoid the difficulties attendant in incoporating a water-insoluble dye into the water-soluble polymer matrix.

When a pigment is used as the colorant, it may be incorporated into the solvent-coalesceable particles or may be dispersed directly into the polymer matrix. Standard pigment dispersing techniques, such as ball milling, sand milling, etc. may be employed. In order to achieve maximum color strength, transparency and gloss, a dispersant, generally an organic polymeric compound, may be used to disperse the pigment and avoid flocculation and agglomeration. A wide range of dispersants are commercially available. A detailed list of non-polymeric as well as some polymeric dispersants are listed in the section on dispersants, pp 110-129, 1990, McCutcheon's Functional Materials, North American Edition, Manufacturing Confection Publishing Co., Glen Rock, N.J., the disclosure of which is incorporated herein by reference.

A dispersant will be selected according to the characteristics of the pigment surface and other components in the composition as practiced by those skilled in the art. In most cases, the polymeric material selected for the polymer matrix of the non-photosensitive layer may perform this function, thus eliminating the need for an additional pigment dispersant.

In accordance with principles well known to those skilled in the art, the concentration of colorant will be chosen to achieve the optical density desired in the final image.

The non-photosensitive layer may be conveniently prepared by dissolving or suspending the various ingredients in a suitable solvent, such as water. This mixture may then be coated on the substrate, or cast if no substrate is used, prior to evaporating the solvent. Alternatively, if the resulting element is one which will be devoid of a substrate, the mixture may be coated on a releasable support, which support can then be removed prior to application of the ink to the non-photosensitive layer. Care should be taken not to prepare the non-photosensitive layer in a solvent which will coalesce the polymer particles present in the layer.

Ink

In the process of the present invention, an ink is applied in imagewise fashion to the non-photosensitive layer, which renders the non-photosensitive layer insoluble in the ink applied areas and coalesces the particles. Preferably, the ink is applied using an ink jet printing apparatus.

The ink comprises a solvent which will react with the particles present in the non-photosensitive layer to dissolve and/or plasticize the particles to form a continuous phase, water-insoluble polymer blend between the coalesced particles and the water-soluble polymer matrix. The water-insoluble component of the blend would be dominant so as to render the blend insoluble in an aqueous media. The selection of a particular solvent will depend upon the type and molecular weight of the polymers used in the particles and in the polymer matrix. Useful solvents are liquids at room temperature and will have a high dissolving power for the polymers selected for the system, reasonably high volatility so that they dry rapidly once applied, low toxicity, and preferably do not have an offending odor.

Examples of solvents which may be used to advantage include:

(1) alcohols, such as methanol, ethanol, 1-propanol, 2-propanol, 1-butanol, etc.;

(2) ketones, such as acetone, methylethyl ketone, methyl isobutyl ketone, cyclohexanone, etc.;

(3) cyclic and acyclic ethers, such as tetrahydrofuran, ethyleneglycol monomethyl ether, etc;

(4) esters, such as ethyl acetate, etc.;

(5) aromatics, such as benzene, toluene, xylene, etc.;

(6) chlorinated solvents, such as methylene chloride, chloroform, carbon tetrachloride, ethylene dichloride, trichloroethylene, etc;

(7) amides, such as N,N-dimethylformaide, N,N-dimethylacetamide, etc.;

(8) nitrogen-containing cyclic compounds, such as pyrrolidone, N-methyl-2-pyrrolidone, etc.; and (9) dimethyl sulfoxide ("DMSO").

Organic plasticizers, usually high molecular weight liquids or low-melting solids, are often used to lower the glass transition temperature (Tg) of a polymer for various applications and are generally effective solvents for the polymer. These plasticizers may also be used as the coalescing solvents for the present invention, either alone or in combination with the solvents mentioned above. Examples of useful plasticizers include esters of carboxylic acids, esters of phosphoric acid, ethers, polyglycols, sulfonamides, hydrocarbons, and halogenated hydrocarbons.

The type and amount of plasticizer is selected based on the polymers used in the non-photosensitive layer, and the guidelines for selecting plasticizers can be found in "The Technology of Plasticizers" by J. K. Sears and J. R. Darby, published by John Wiley & Sons, New York. Since the plasticizers are usually designed as a permanent additive to the polymer blends, they tend to have low volatility. Hence, care should be taken in using these plasticizers to avoid interference with the development step and degradation of the robustness of the finished image.

The ink may also contain other ingredients, which will depend primarily upon the method being used to apply the ink to the non-photosensitive layer. In the process of this invention, the ink is preferably applied to the layer using ink jet printing techniques. Ink jet printing is a non-impact printing process in which an electronic signal produces droplets of ink that are deposited on a substrate. Ink jet printers are broadly utilized as output for personal and other computers due to their reliability, print quality, low cost, relatively quiet operation and graphics capability.

Although ink jet printing is the preferred method of applying the ink, it is to be understood that the invention is not limited to ink jet printing. Rather, the ink layer may also be applied with conventional writing implements (e.g. felt tip pens, fountain pens, paint brushes) or by other techniques such as screen printing, which are known in the art. It will be apparent that the particular technique of applying the ink will depend upon the desired application and the demands thereof.

For ink jet printing, the physical properties of the ink should be compatible with the components in the print head and the ink ejecting conditions, i.e. driving voltage, frequency, and pulse width for thermal ink jet printing devices; driving frequency of the piezo element for either a drop-on-demand or a continuous device; and the shape and size of the nozzles. The ink viscosity needs to match the print head design to ensure smooth delivery of ink droplets. Useful viscosities for the typical print heads are below 20 c/P, preferably below 10 cP at 20° C. Surface tension is also an important property because it prevents the ink from dripping out and wetting the nozzle plate and helps maintain the directionality of the ink droplet and the droplet integrity in the air to avoid splattering. Useful surface tension ranges from 18–80 dyne/cm, preferably 25–70 dyne/cm at 20° C.

Ink jet printing devices equipped with print heads designed to handle organic solvent systems, such as the solvents described above, are commercially available from e.g. Videojet Systems, Division of A. B. Dick Co., Elk Grove Village, Ill. Because many of the solvents described above are water-miscible compounds, however, it is preferable to use aqueous based inks for environmental and safety and health reasons. A wide variety of ink jet printing devices for use with aqueous based inks are commercially available.

For an aqueous based ink jet ink, the coalescing solvent is formulated in an aqueous carrier medium which comprises water (preferably deionized water) or a mixture of water and at least one water-soluble organic solvent (other than the selected coalescing solvent) having at least one hydroxyl group.

Wash-Off Development

After the element has been imaged with the ink, the non-imaged areas are removed with an aqueous solution, preferably water. Depending upon the type of material used in the polymer matrix of the non-photosensitive layer, the developer may be neutral, acidic or basic, based upon its ability of reacting with the functional groups such as the acid or amine groups on the polymer to form an aqueous soluble salt.

For instance, an aqueous alkaline developer containing, for example, alkali metal hydroxides, carbonates, bicarbonates; metasilicates; amines; alcohol amines; ammonium salts; or pyridine, would be suitable for use in developing elements containing acid functional groups in the polymer matrix. Similarly, aqueous acidic developers containing, for example, organic, inorganic, halogenated or hydroxylated acids, would be suitable in developing elements containing basic functional groups (e.g. amine) in the polymer matrix. One of ordinary skill in the art is capable of determining the optimum amount of the salt-forming compound for a given application by routine experimentation.

Optionally, the developer may contain low levels of water-soluble surfactants to facilitate the. interaction between the the developer solution and the polymer matrix.

The development step comprises immersing the imaged element into the aqueous developer solution to dissolve away the non-imaged areas. It is particularly advantageous to gently agitate the developer solution, which facilitates removal of the non-imaged areas of the non-photosensitive layer. Even still, in some instances gentle rubbing may be necessary to completely remove the non-imaged areas. Maintaining the developer at a slightly elevated temperature facilitates more effective development.

A one-color image can be produced by using a pre-colored non-photosensitive layer and following the imaging and development steps described above. To prepare a multicolor overlay proof, a series of one-color images is prepared, each on a transparent support. Each one-color image corresponds to a color separation. The series of one-color images are then stacked in register on a white background to produce a multicolor overlay proof. A typical overlay proof consists of yellow, magenta, cyan, and black images, each produced from the corresponding color separations.

To prepare a multicolor surprint proof, elements that additionally comprise a thin layer, about 1 μm thick, of heat sensitive adhesive between the substrate and the non-photosensitive layer are used. A series of developed images, each corresponding to a different color separation of the multicolor image to be reproduced, is prepared as described above. The first developed image is laminated to a transfer sheet and the substrate is removed revealing the heat sensitive adhesive layer. Alternatively, if the heat sensitive layer is not present, a thin layer of adhesive may be coated on the image revealed by removal of the substrate. The second developed image is laminated in register to the previously formed image on the transfer sheet and the substrate removed. The process is repeated for each of the developed images. The multicolor image is transferred to the desired substrate by lamination. The transfer sheet is preferably removed following lamination, but, if transparent, it may be left in place to protect the image. Although the image can be transferred to any of numerous substrates, such as, for example, paper, cloth, glass, china, metal sheet, polymer film, and the like, it will typically be transferred to the paper on which it will be printed.

INDUSTRIAL APPLICABILITY

This invention is particularly useful in the field of graphic arts, such as printing plate, imagesetting, color proofing (including overlays and surprints), and in the field of electronics, such as solder masks, resists for printed circuit boards, dielectric layers, etc.

The invention is also suitable for use in producing a photomask for conventional imaging applications and may advantageously be integrated into such a system by laminating a precolored element of the present invention to a photopolymer composition, for example. The composite structure is then imaged as described herein to create the mask, and is then exposed in the normal manner. After removal of the photomask, the exposed element may then be processed in the usual way.

The present invention also has a variety of applications in novelty items, arts and crafts items, decorative items, etc., which may be imaged by the consumer with a personal message or drawing, or may be preimaged and merely developed by the consumer by washing.

EXAMPLES

GLOSSARY

Acrysol ® I-62: Colloidal dispersion of an alkali-soluble acrylic polymer, 50% solids; Rohm and Haas, Philadelphia, Pa.

Carboset ® XL-37: Colloidal dispersion of an alkali-soluble acrylic polymer, 35% solids; B. F. Goodrich Co., Cleveland, Ohio Enduraphthal Blue: Enduraphthal Blue BT-583 pigment; Pigment Blue 15:3; Cookson Pigments, Newark, N.J.

Monastral ® magenta R-143D pigment: Pigment Red 220; Ciba Geigy, Newport, Del.

Sunfast ® magenta 122 pigment: Sun Chemical Co., Cincinnati, Ohio

Sunbrite ® yellow 17 pigment: Sun Chemical Co., Cincinnati, Ohio

Emulsion I

This illustrates the preparation of a core-shell dispersion composed of particles that have a core of polystyrene and a shell of the carboxylated acrylic copolymer.

To a 2 L reaction flask equipped with stirrer, condenser, thermometer, and nitrogen inlet/outlet, was added 414 mL of distilled water. To the stirred water was added 85.8 mL of Carboset ® XL-37, followed by 16 mL of 25% aqueous ammonia. When a crystal clear solution was obtained, 150 grams of styrene were added, followed by 1.5 grams of ammonium persulphate in 10 mL of distilled water. The mixture was maintained at 65° C. with vigorous stirring for a period of four hours to give a final product having a 25% w/w solids content with a particle size of less than 0.5 μm and a residual monomer content of 0.01% w/w.

Emulsion II

This illustrates the preparation of a dispersion of polystyrene.

To a reaction flask equipped with mechanical stirrer, thermometer, nitrogen purge, condenser and monomer inlet, was added 250 mL of distilled water, 1.5 grams of sodium lauryl sulphate, and 0.75 grams of ammonium persulphate, and the mixture heated to 70° C. Over a period of three hours, 75 grams of styrene were added, during which time the temperature rose to 85° C. The flask was maintained at 80°–85° C. for an additional three hours. The mixture was cooled and filtered to give a final product having solids content of 23.9% w/w, with a residual monomer content of <0.02% w/w.

Example 1

A mixture of 25 grams of Sunfast ® Magenta 122 pigment, 55.1 grams of Acrysol ® I-62 (22.7% neutralized with N, N-dimethylethanolamine, and 62.7 grams of deionized water was stirred until no lumps or dry clumps of pigment were visible. The mixture was milled at 4500 rpm in a Mini Motormill 250 (Eiger Machinery Inc., Bensenville, Ill.) using 0.5 mm glass beads as the media. The milling continued for 4 hours to give a pigment dispersion with particles having a size of 158 nm as determined by a Brookhaven ® BI-90 Particle Sizer (Brookhaven Instruments Corp., Holtsville, N.Y.).

To 2.0 grams of the magenta pigment dispersion, the following ingredients were slowly added in order with vigorous agitation: deionized water, 0.5 gram; Emulsion I, 4.5 grams; Isopropanol, 5.0 grams. The mixture was roll milled for 2 hours and was then coated on 3 mil (75 μm) thick resin-subbed Mylar ® base using a 0.010" wire wound coating bar.

After drying, the coating was imaged with an ink having the following composition: butyl carbitol, 0.6 gram; isopropanol, 10.0 grams; deionized water, 9.4 grams. The imaging step was carried out using a thermal ink jet printhead on a standard Hewlett Packard DeskJet ink jet printer equipped with a heating element and an overhead blower for fast drying.

The non-imaged areas were washed off in an alkaline developer solution, ethanolamine Electrosol ® 85; (DuPont-Howson Printing Systems, Leeds, England), which had been diluted 1:6 with water, to give a positive image. The developed imaged was then rinsed with water. A high density, high resolution bright magenta image with dots having sharp edges was obtained.

Example 2

A yellow pigment dispersion was prepared using the procedure described in Example 1, which dispersion contained 25 grams of Sunbrite ® Yellow 17 pigment, 55.1 grams of Acrysol ® I-62 (22 7% solids, neutralized with N,N-dimethylethanolamine and 62.7 grams of deionized water. The resulting pigment dispersion had a particle size of 266 nm as determined by Brookhaven ® BI-90 Particle Sizer To 2.0 grams of the yellow pigment dispersion, the following ingredients were slowing added in order with vigorous agitation: deionized water, 1.5 gram; Emulsion I, 4.5 grams; and isopropanol, 5.0 gram. The mixture was roll milled, coated, dried, imaged, and developed as described in Example 1. A high density, high resolution bright yellow image with dots having sharp edges was obtained.

Example 3

A cyan pigment dispersion containing 25 grams of Endurophthal Blue BT-583 pigment, 55.1 grams of Acrysol ® I-62 (22.7% solids, neutralized with N,N-dimethylethanolamine) and 62.7 grams of deionized water was prepared using the procedure described in Example 1, except the milling step was continued for only 1 hour. The resulting pigment dispersion had a particle size of 134 nm as determined by Brookhaven ® BI-90 Particle Sizer.

To 2.0 grams of the cyan pigment dispersion, the following ingredients were slowly added in order with vigorous agitation: Emulsion I, 4.5 grams; and isopropanol, 5.0 grams. The mixture was roll milled, coated, dried, imaged, and developed as described in Example 1. A high density, high resolution bright cyan image with dots having sharp edges was obtained.

Example 4

Example 3 was repeated using a black pigment dispersion comprising 60 grams of FW 18 carbon black pigment (Degussa Corp., Allendale, N.J.), 132.2 grams of Acrysol ® I-62 (22.7% solids, neutralized with N,N-dimethylethanolamine) and 207.8 grams of deionized water was prepared using the procedure described in Example 3. The resulting pigment dispersion had a particle size of 131 nm as determined by Brookhaven ® BI-90 Particle Sizer.

A high density, high resolution black image with dots having sharp edges was obtained.

Example 5

Example 1–4 were repeated, except that the elements were imaged with an ink comprising Liponic ® EG-1(a glycerol-ethylene oxide condensate with an average of 26 moles of ethylene oxide units per molecule of glycerol marketed by Chemicals Inc., Paterson, N.J.), 2.0 grams; isopropanol, 10.0 grams; and deionized water, 8.0 grams. Similar results were obtained.

Example 6

A magenta pigment dispersion was prepared by roll milling the following ingredients with 25 grams of ⅛ steel shot overnight:
   4.0 grams of Monastral ® magenta R143D pigment
   5.7 grams of Carboset ® XL-37
   0.3 grams of ammonium hydroxide solution (29.6% solids)
   10.0 grams of deionized water.

To 1.0 grams of the resulting magenta pigment dispersion, the following ingredients were slowly added in order with vigorous agitation: Carboset ® XL-37 (20% neutralized with ammonium hydroxide), 1.3 gram; Emulsion II, 3.1 grams; and isopropanol, 5.0 grams. The mixture was roll milled, coated, dried, imaged, and developed as described in Example 1, with the exception that an ink containing 50% of tetrahydrofuran in deionized water was used to image the coating on a standard Hewlett Packard Deskjet ink jet printer without the heating element and the blower. A high resolution magenta image with dots having sharp edges was obtained.

Example 7

Example 6 was repeated using a cyan pigment dispersion comprising 4.0 grams of Enduraphthal Blue BT-583D pigment, 5.7 grams of Carboset® XL-37 (35% solids), 0.3 grams of ammonium hydroxide solution (29.6% solids) and 10.0 grams of deionized water.

A high density, high resolution cyan image with dots having sharp edges was obtained.

Example 8

A magenta pigment dispersion comprising 30 grams of Monastral® Magenta R143D pigment, 66.1 grams of Acrysol® I-62 (22.7% solids, neutralized with N,N-dimethylethanolamine) and 53.9 grams of deionized water was prepared as in Example 1, except that the milling step lasted 2 hours.

To 1.5 grams of the resulting magenta pigment dispersion, the following ingredients were slowly added in order with vigorous agitation: deionized water, 1.0 gram; Acrysol® I-62 (22.7% solids, neutralized with N,N-dimethylethanol amine), 0.8 gram; Emulsion II, 3.5 grams; and isopropanol, 5.0 grams. The mixture was roll milled, coated, dried, imaged, and developed as described in Example 6, with the exception that an ink containing 90% of isopropanol in deionized water was used to image the coating. A high resolution magenta image with dots having sharp edges was obtained.

What is claimed is:

1. An aqueous solution developable element containing a latent image, said element comprising a non-photosensitive, aqueous processable layer, said layer comprising:
   (a) non-imaged areas comprising a dispersion of solvent-coalesceable particles in a polymer matrix; said polymer matrix being capable of being removed with an aqueous developer; and
   (b) imaged areas comprising a latent image in the form of a stable, water-insoluble polymer blend of the particles and the polymer matrix.

2. The element according to claim 1, wherein the solvent-coalesceable particles comprise a water-insoluble, solvent-coalesceable polymer.

3. The element according to claim 2, wherein the water-insoluble, solvent-coalesceable polymer is selected from the group consisting of polystyrene, polyacrylates, polyesters, polyvinylesters, polyurethanes, polyamides, polyepoxides and polyvinyl chloride.

4. The element according to claim 1, wherein the solvent-coalesceable particles have a particle size smaller than 5 $\mu$m.

5. The element according to claim 1, wherein the polymer matrix is selected from the group consisting of polyvinylpyrrolidone, polyvinylalcohol, polyethyleneoxide, carboxylated polymers, amine-containing polymers, sulfonate-containing polymers and sulfonamide-containing polymers.

6. The element according to claim 1, wherein the solvent-coalesceable particles have a core-shell structure comprising a water-insoluble, solvent-coalesceable core and a shell of a polymeric material that is soluble or swellable in the aqueous developer solution.

7. The element according to claim 1, wherein the non-photosensitive, aqueous processable layer contains a colorant.

8. The element according to claim 1 wherein said layer is on a substrate.

9. The element according to claim 8, wherein the substrate is a film or screen.

* * * * *